United States Patent [19]
Fujita

[11] Patent Number: 4,704,187
[45] Date of Patent: Nov. 3, 1987

[54] METHOD OF FORMING A LEAD FRAME

[75] Inventor: Katsufusa Fujita, Kitakyushu, Japan

[73] Assignee: Mitsui High-Tec Inc., Kitakyushi, Japan

[21] Appl. No.: 875,134

[22] Filed: Jun. 17, 1986

[30] Foreign Application Priority Data

Nov. 13, 1985 [JP] Japan .................................. 60-254330

[51] Int. Cl.⁴ ........................ B44C 1/22; H01R 43/00; H01L 23/48
[52] U.S. Cl. .................................... 156/645; 156/654; 156/901; 29/827; 357/70
[58] Field of Search ..................... 156/645, 654, 659.1, 156/901; 29/827; 357/70

[56] References Cited

U.S. PATENT DOCUMENTS 3,537,175 11/1970 Clair et al. ............................ 29/827

FOREIGN PATENT DOCUMENTS 0013775 2/1979 Japan ..................................... 357/70
0173858 10/1983 Japan ..................................... 29/827

Primary Examiner—S. Leon Bashore
Assistant Examiner—Thi Dang
Attorney, Agent, or Firm—Schwartz & Weinrieb

[57] ABSTRACT

In a lead frame for a semiconductor device, inner leads are formed by etching and outer leads are formed by pressing.

12 Claims, 2 Drawing Figures

METHOD OF FORMING A LEAD FRAME

BACKGROUND OF THE INVENTION

1. Field of the Invention

The present invention relates to a method of forming a lead frame for use in the fabrication of a semiconductor device.

2. Description of the Prior Art

A semiconductor device such as an IC or an LSI is fabricated by mounting a semiconductor integrated circuit on a pad 1 of a lead frame as shown in FIG. 1, interconnecting terminals of the semiconductor integrated circuit to inner leads 2 of the lead frame by means of a gold or aluminum wire bonding process and further sealing the resultant integrated circuit with resin or ceramic.

In FIG. 1, reference numeral 3 is an outer lead, 4 and 5 are side rails, 6a and 6b are tie bars (dam bars), and 7 is a support bar.

There are conventionally two methods of forming such a lead frame, namely, by etching and by pressing using a lead frame blanking die.

The former method is suitable for the fine processing of the tip ends of the inner leads 2, while it is disadvantageous in that the production cost is high because deteriorated etching solution must be continuously or periodically exchanged.

On the other hand, the latter method is advantageous in that the production costs can be rendered low, but is disadvantageous in that when fine processing is desired, a very small blanket chip raised together with a punch during the upward movement of a press may cause damage to the die and it is rather difficult to make such a die, and in addition the product accuracy is inferior as compared to that made according to the former forming method.

OBJECTS OF THE INVENTION

It is an object of the present invention to provide a method of forming a lead frame which can maintain its processing accuracy as high as the case wherein the lead frame is formed only by an etching process, and can slow the deterioration rate of the etching solution and increase the amount of recovered scrap, thereby lowering production costs.

It is another object of the present invention to provide a method of forming a lead frame which eliminates the process of blanking fine parts of the lead frame with the use of a die, thereby preventing damage to the die caused by the upward motion of a blanked chip and, in addition, facilitates the formation of the die.

SUMMARY OF THE INVENTION

In accordance with the present invention, the above objects are attained by forming the inner leads of the lead frame by means of an etching process and by forming the outer leads of the lead frame by means of a pressing process.

BRIEF DESCRIPTION OF THE DRAWINGS

Various other objects, features, and attendant advantages of the present invention will become better understood upon reference being made to the accompanying drawings, in which like reference characters are used throughout the several views to indicate like or similar parts, and wherein.

DESCRIPTION OF THE PREFERRED EMBODIMENT

The present invention will be described in detail with reference to the accompanying drawings.

Figure 1:
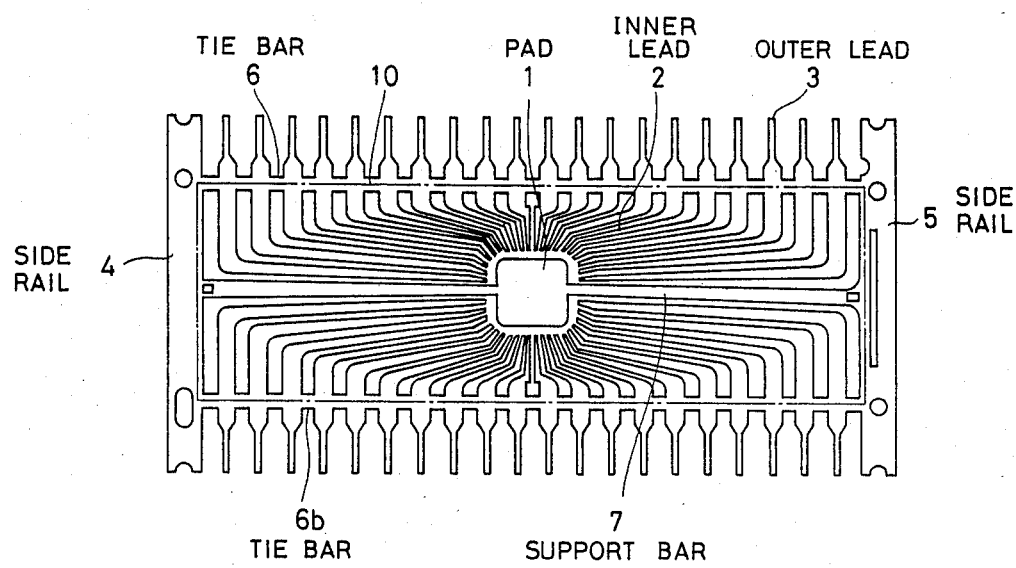
FIG. 1 is a magnified plan view of a dual-in-line lead frame for explanation of the prevent invention.

Referring to FIG. 1, there is shown a dual-in-line lead frame which comprises a pad 1 on which a semiconductor integrated circuit is mounted, forty inner leads 2, forty outer leads 3, two side rails 4 and 5, two tie bars 6a and 6b interconnecting the inner and outer leads so as to prevent any leakage of resin from molding parts upon conducting resin molding, and a support bar 7 supporting the pad 1.

Such a lead frame as mentioned above is formed by using two processes, that is, an etching process and a pressing process. More specifically, a zone 10 surrounded by the side rails 4 and 5 and the tie bars 6a and 6b and including the pad 1 (that is, the pad 1, the inner leads 2 and the support bar 7) is formed by means of the etching process; whereas an area other than the etching zone 10 (that is, the outer leads 3) is formed by means of the pressing process using a special die.

Either one of these two processes may be carried out prior to the other, but when the processes are performed in the order of the pressing, plating and the etching processes, this is advantageous in that minute tip ends of the inner leads can be prevented from being caught during their handling during the plating process.

Figure 2:
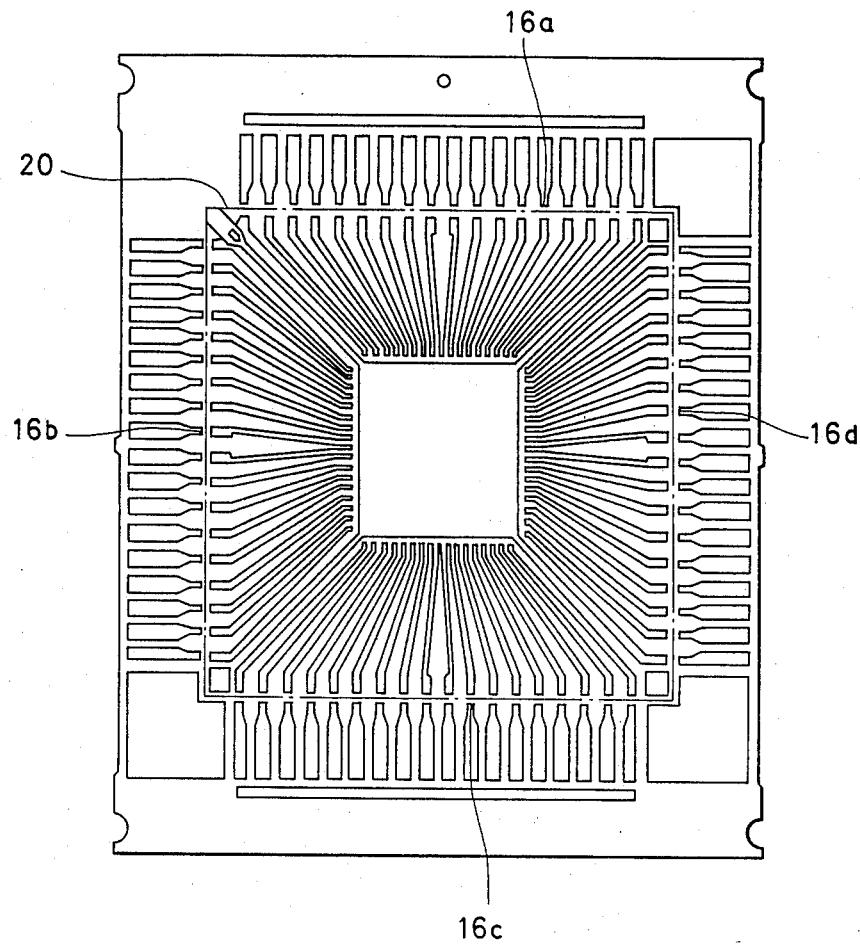
FIG. 2 is a magnified plan view of a quad lead frame for explanation of the present invention.

There is shown in FIG. 2, a magnified plan view of a quad lead frame. This type of lead frame is formed in a manner similar to the above-mentioned dual-in-line lead frame. That is, a zone 20 surrounded by tie bars 16a, 16b, 16c and 16d, that is, the inner lead section, is formed by means of an etching process, while an area other than the etching zone 20, that is, the outer lead section, is formed by means of a pressing process.

The etching zones 10 and 20 may be made smaller so as to carry out the pressing process over relatively rough processing parts of the inner leads. Further, since the outer leads have substantially the same configuration pattern for the same pin number, an identical outer lead formation die can be used to produce outer leads of the same pin number.

Obviously, many modifications and variations of the present invention are possible in light of the above teachings. It is therefore to be understood that within the scope of the appended claims, the present invention may be practiced otherwise than as specifically described herein.

What is claimed as our invention is:

1. A method of forming a lead frame comprising the steps of:
    forming inner lead portions of said lead frame by means of an etching process so as to achieve high processing accuracy while minimizing the deterioration rate of the etching solution employed within said etching process; and
    forming outer lead portions of said lead frame by means of a pressing process using a pressing die so as to prevent potential damage to said pressing die which may normally occur if said inner lead portions of said lead frame were also formed by said pressing process.

2. A method as set forth in claim 1, wherein said etching step is carried out prior to said pressing step.

3. A method as set forth in claim 1, wherein said pressing step is carried out prior to said etching step.

4. A method as set forth in claim 3, further comprising a plating step between said etching and pressing processes.

5. A method as set forth in claim 1, wherein:
said lead frame comprises a dual-in-line lead frame.

6. A method as set forth in claim 5, wherein said dual-in-line lead frame comprises:
a pair of side rails disposed parallel to each other;
a pair of tie bars extending substantially perpendicular to said pair of side rails and interconnecting said pair of side rails together;
a pad disposed centrally of said lead frame for supporting a semiconductor integrated circuit; and
a support bar extending substantially parallel to said tie bars and substantially perpendicular to said side rails for supporting said pad relative to said side rails.

7. A method as set forth in claim 6, wherein:
said tie bars separate said inner lead portions of said lead frame from said outer lead portions of said lead frame.

8. A method as set forth in claim 6, wherein:
a zone is defined by means of said side rails, said tie bars, said inner lead portions, said pad, and said support bar, wherein all portions of said lead frame within said zone are formed by said etching process, and all portions of said lead frame outside of said zone are formed by said pressing process.

9. A method as set forth in claim 1, wherein:
said lead frame comprises a quad lead frame.

10. A method as set forth in claim 9, wherein said quad lead frame comprises:
four tie bars arranged in a substantially square array separate said inner lead portions from said outer lead portions.

11. A method as set forth in claim 10, wherein said quad lead frame further comprises:
a pad disposed centrally of said lead frame for supporting a semiconductor integrated circuit; and
four support bars, arranged in a substantially X-shaped pattern and extending from the corner junctions of said tie bars to the central portion of said lead frame, for supporting said pad relative to said tie bars.

12. A method as set forth in claim 11, wherein:
a zone is defined by means of said tie bars, said inner lead portions, said pad, and said support bars, wherein all portions of said lead frame disposed interiorly within said zone are formed by said etching process, while all portions of said lead frame disposed exteriorly of said zone are formed by said pressing process.

* * * * *